(12) United States Patent
Zhang et al.

(10) Patent No.: US 10,896,829 B2
(45) Date of Patent: Jan. 19, 2021

(54) EXCIMER LASER ANNEALING APPARATUS

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Yu Zhang, Beijing (CN); Zubin Lv, Beijing (CN); Yin Xie, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 274 days.

(21) Appl. No.: 15/981,209

(22) Filed: May 16, 2018

(65) Prior Publication Data
US 2019/0115232 A1 Apr. 18, 2019

(30) Foreign Application Priority Data
Oct. 13, 2017 (CN) .......................... 2017 1 0953870

(51) Int. Cl.
*H01L 21/67* (2006.01)
*B23K 26/00* (2014.01)
(Continued)

(52) U.S. Cl.
CPC .... *H01L 21/67115* (2013.01); *B23K 26/0006* (2013.01); *B23K 26/14* (2013.01);
(Continued)

(58) Field of Classification Search
CPC . H01L 21/67115; B23K 26/006; B23K 26/14; B23K 26/0081
(Continued)

(56) References Cited

U.S. PATENT DOCUMENTS 4,715,318 A * 12/1987 Kameyama ........... C23C 16/488
118/50.1
5,424,244 A * 6/1995 Zhang .................... B60R 25/066
438/301
(Continued)

FOREIGN PATENT DOCUMENTS

CN 102231469 A 11/2011
CN 104822219 A 8/2015
(Continued)

OTHER PUBLICATIONS

The First Chinese Office Action dated May 27, 2019; Appln No. 201710953870.4.
(Continued)

*Primary Examiner* — Thien S Tran

(57) ABSTRACT

An excimer laser annealing apparatus is provided. The excimer laser annealing apparatus includes: a laser output channel, at least one first intake pipe and at least one second intake pipe, the laser output channel includes two end faces facing to each other and a side face connected with both of the two end faces; the at least one first intake pipe is located on the side face; and the at least one second intake pipe is located on at least one of the two end faces.

20 Claims, 4 Drawing Sheets

(51) Int. Cl.
  *H01L 21/02* (2006.01)
  *B23K 26/14* (2014.01)
  *B23K 26/354* (2014.01)

(52) U.S. Cl.
  CPC ...... *B23K 26/354* (2015.10); *H01L 21/02532* (2013.01); *H01L 21/02595* (2013.01); *H01L 21/02686* (2013.01); *H01L 21/02592* (2013.01); *H01L 21/02675* (2013.01)

(58) Field of Classification Search
  USPC ............. 219/121.63, 121.67, 121.68, 121.84
  See application file for complete search history.

(56) References Cited

U.S. PATENT DOCUMENTS

| | | | | |
|---|---|---|---|---|
| 2002/0142567 | A1* | 10/2002 | Hagino | H01L 21/02675 438/487 |
| 2005/0133565 | A1* | 6/2005 | Lee | H01L 21/268 228/101 |
| 2011/0207256 | A1* | 8/2011 | Su | C23C 16/56 438/46 |
| 2011/0318905 | A1* | 12/2011 | Chiruvolu | C09D 11/52 438/478 |
| 2015/0299861 | A1* | 10/2015 | Leconte | C23C 16/26 427/586 |
| 2017/0103876 | A1* | 4/2017 | Tian | H05H 1/46 |

FOREIGN PATENT DOCUMENTS

| | | |
|---|---|---|
| CN | 20170103876 U | 8/2015 |
| JP | 2000-31082 A * | 1/2000 |
| JP | 2007-288128 A | 11/2007 |

OTHER PUBLICATIONS

Second Chinese Office Action dated Apr. 28, 2020; Application No. 201710953870.4.

* cited by examiner

EXCIMER LASER ANNEALING APPARATUS

CROSS-REFERENCE TO RELATED APPLICATIONS

The application claims priority to the Chinese patent application No. 201710953870.4, filed on Oct. 13, 2017, the entire disclosure of which is incorporated herein by reference as part of embodiments of the present application.

TECHNICAL FIELD

Embodiments of the present disclosure relate to an excimer laser annealing apparatus.

BACKGROUND

A poly-silicon layer in a display device is often formed by using an excimer laser annealing process. For example, the excimer laser annealing process can refer to that an amorphous silicon layer on a substrate to be processed is irradiated for a short period of time to be recrystallized into a poly-silicon layer by utilizing an excimer laser beam emitted from an excimer laser annealing apparatus.

SUMMARY

At least one embodiment of the disclosure provides an excimer laser annealing apparatus.

An embodiment of the disclosure provides an excimer laser annealing apparatus, comprising: a laser output channel, comprising two end faces facing to each other and a side face connected with both of the two end faces; at least one first intake pipe, located on the side face; and at least one second intake pipe, located on at least one of the two end faces.

According to the excimer laser annealing apparatus provided by the embodiment of the disclosure, the first intake pipe is connected with the side face, and the second intake pipe is connected with the end face on which the second intake pipe is located.

According to the excimer laser annealing apparatus provided by the embodiment of the disclosure, the first intake pipe comprises a first proximal end that is connected with the side face, and the second intake pipe comprises a second proximal end that is connected with the end face on which the second intake pipe is located, and the first proximal end and the second proximal end are perpendicular to each other.

According to the excimer laser annealing apparatus provided by the embodiment of the disclosure, the first proximal end is perpendicular to the side face, and the second proximal end is perpendicular to the end face.

According to the excimer laser annealing apparatus provided by the embodiment of the disclosure, each of the two end faces is provided with at least one second intake pipe.

According to the excimer laser annealing apparatus provided by the embodiment of the disclosure, the excimer laser annealing apparatus further comprises a gas diffuser, located in at least one of the first intake pipe and the second intake pipe and configured to control at least one of a gas flow velocity and a gas amount of a gas input to the laser output channel.

According to the excimer laser annealing apparatus provided by the embodiment of the disclosure, the gas diffuser is located in at least one of a first proximal end where the first intake pipe is connected with the side face and a second proximal end where the second intake pipe is connected with the end face on which the second intake pipe is located.

According to the excimer laser annealing apparatus provided by the embodiment of the disclosure, the excimer laser annealing apparatus further comprises a plurality of gas detectors distributed within the laser output channel, wherein each of the plurality of the gas detectors is configured to detect a gas concentration of a position where the gas detector is located.

According to the excimer laser annealing apparatus provided by the embodiment of the disclosure, an inner diameter of the first intake pipe is the same as that of the second intake pipe.

According to the excimer laser annealing apparatus provided by the embodiment of the disclosure, the side face is provided with a plurality of first intake pipes, and distances between any of adjacent first intake pipes are equal.

According to the excimer laser annealing apparatus provided by the embodiment of the disclosure, positions where the plurality of the first intake pipes are connected with the side face respectively are located in a straight line.

According to the excimer laser annealing apparatus provided by the embodiment of the disclosure, positions where the plurality of the first intake pipes are connected with the side face respectively and a position where the second intake pipe is connected with the end face on which the second intake pipe is located, are located in a same plane.

According to the excimer laser annealing apparatus provided by the embodiment of the disclosure, the excimer laser annealing apparatus further comprises a gas source configured to provide a gas, wherein the gas source is connected with the at least one first intake pipe and the at least one second intake pipe.

According to the excimer laser annealing apparatus provided by the embodiment of the disclosure, the laser output channel has a bar shape outside and a hollow space inside.

According to the excimer laser annealing apparatus provided by the embodiment of the disclosure, the excimer laser annealing apparatus further comprises a laser generator configured to generate laser, wherein the laser generated by the laser generator is directed to the laser output channel.

According to the excimer laser annealing apparatus provided by the embodiment of the disclosure, the excimer laser annealing apparatus further comprises a laser annealing chamber, wherein the laser output channel is connected with the laser annealing chamber, the laser enters the laser output channel and then enters the laser annealing chamber.

According to the excimer laser annealing apparatus provided by the embodiment of the disclosure, a direction of a gas flow flowing into the laser output channel through the first intake pipe is parallel with a direction of the laser travelling in the laser output channel, and a direction of a gas flow flowing into the laser output channel through the second intake channel is perpendicular to the direction of the laser travelling in the laser output channel.

According to the excimer laser annealing apparatus provided by the embodiment of the disclosure, the laser output channel is located on a wall of the laser annealing chamber.

According to the excimer laser annealing apparatus provided by the embodiment of the disclosure, the laser output channel has a laser outlet, and the laser outlet is communicated with the laser annealing chamber.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," or "include," or "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Quality of an excimer laser annealing process determines quality of a process of converting amorphous silicon into poly-silicon. In general, laser generated by a laser generator in an excimer laser annealing apparatus enters a laser output channel and then transmits in the laser output channel and exits the laser output channel. Because a conventional cuboid-shaped laser output channels is only provided with an intake pipe on a side face of the laser output channel, gas atmosphere at a middle position and both end positions of the laser output channel is non-uniform, resulting in non-uniform of energy of the laser beam exiting from different positions of the laser output channel, further resulting in non-uniform issues of the formed poly-silicon layer.

Figure 1:
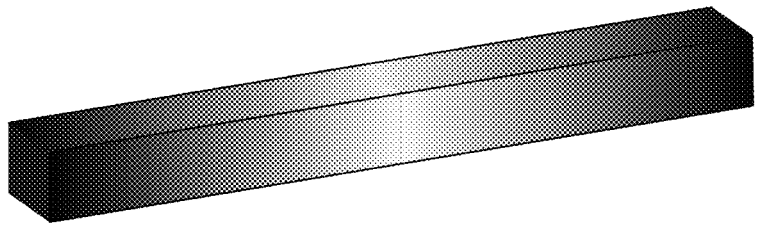
FIG. 1 is a schematic diagram of gas atmosphere distribution in a laser output channel.
Figure 2A:
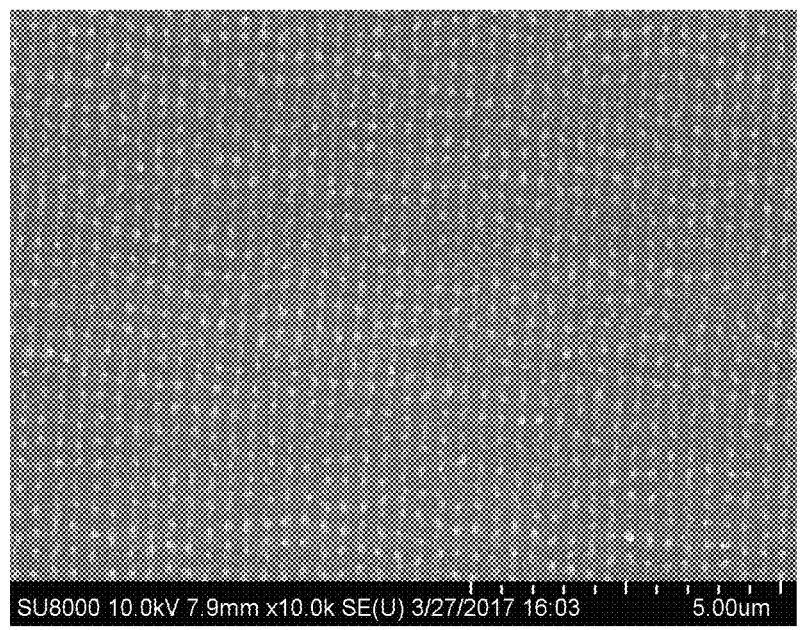
FIG. 2A is a schematic diagram of grain distribution in a middle position of a poly-silicon layer formed by an excimer laser annealing apparatus with the laser output channel of FIG. 1.
Figure 2B:
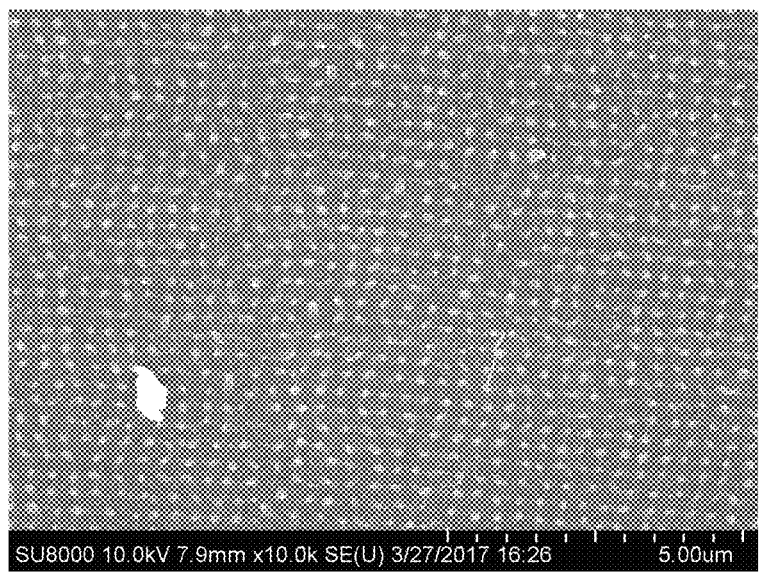
FIG. 2B is a schematic diagram of grain distribution at an edge position of a poly-silicon layer formed by an excimer laser annealing apparatus with the laser output channel of FIG. 1.

Referring to FIGS. 1, 2A, and 2B, the uniformity of the gas in a laser output channel has a crucial influence on crystallization quality of converting amorphous silicon ($\alpha$-Si) into poly-silicon. FIG. 1 is a schematic diagram of gas atmosphere distribution in a laser output channel 10. As illustrated in FIG. 1, gas concentration at both ends (left and right ends) of the laser output channel 10 is greatly different from gas concentration at other positions, for example, at a middle position of the laser output channel 10. Laser emitted from the laser output channel 10 as described above is irradiated on amorphous silicon layer and the amorphous silicon is converted into poly-silicon. FIGS. 2A and 2B are schematic diagrams of grain distribution at a middle position and an edge position of a poly-silicon layer.

As illustrated in FIGS. 2A and 2B, a grain size at the middle position and the edge position of the poly-silicon layer is measured and calculated, and an average grain size at the middle position of the poly-silicon layer is 329 nm, and uniformity of grains at the middle position of the poly-silicon layer is 45%, an average grain size at the edge position of the poly-silicon layer is 332 nm, and uniformity of grains at the edge position of the poly-silicon layer is 55%. A difference between the uniformity of the grains at the middle position of the poly-silicon layer and the uniformity of the grains at the edge position of the poly-silicon layer is about 10%, and crystallization quality at the middle position is superior to crystallization quality at the edge position. It can be seen that uniformity of the gas atmosphere distribution has an important influence on the crystallization, which largely affects the crystallization quality of the poly-silicon.

The inventor(s) found that, a main reason that the gas atmosphere distribution affects crystallization quality of poly-silicon is the gas concentration in the laser output channel affects the energy of the laser beam, and the gas concentration distribution is non-uniform, resulting in uneven energy of the laser beam, further resulting in the non-uniform issue of the formed poly-silicon layer.

Figure 3:
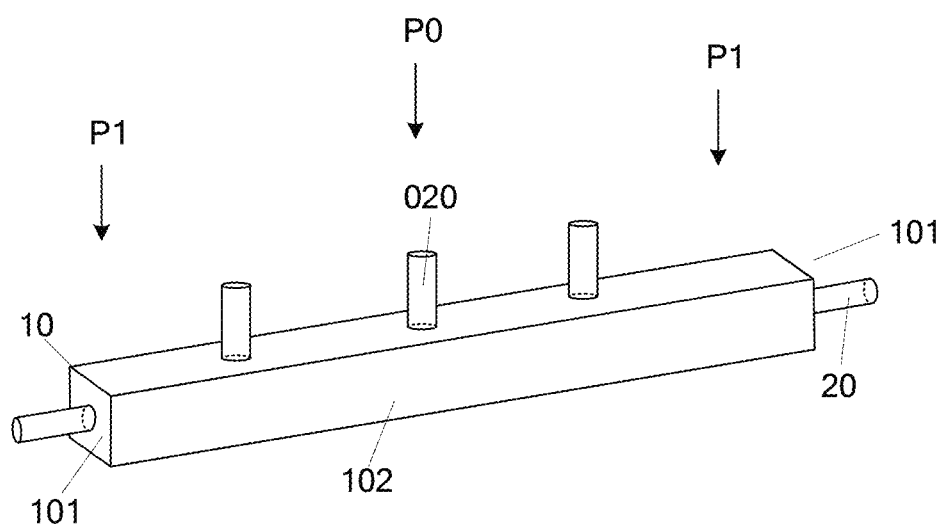
FIG. 3 is a schematic diagram illustrating a structure of an excimer laser annealing apparatus provided by an embodiment of the present disclosure.

FIG. 3 illustrates a schematic perspective view of an excimer laser annealing apparatus provided by at least one embodiment of the present disclosure. As illustrated in FIG. 3, the excimer laser annealing apparatus includes a laser output channel 10. The laser output channel 10 includes two opposite end faces 101 and a side face 102 connected with both of the end faces 101. For example, edges of the two end faces 101 can be connected by the side face 102. The excimer laser annealing apparatus further includes at least one first intake pipe 020 located on the side face 102 and at least one second intake pipe 20 located on at least one of the two end faces 101. The first intake pipe 020 and the second intake pipe 20 are respectively configured to input a gas to the laser output channel 10.

For example, the laser output channel 10 has a bar shape outside and a hollow space inside. For example, two opposite faces having a smaller area in the bar shape are referred to as end faces, and other faces are referred to as side face. For example, in a case that the laser output channel 10 has a cylinder shape, an upper bottom face and a lower bottom face of the cylinder are referred as end faces, and a side face of the cylinder is the side face of the laser output channel. In a case that the laser output channel 10 is a cuboid, two faces of the cuboid that have the smallest area and are opposite to each other, are referred as end faces, and the faces other than the two end faces are referred as side face.

For example, the number of the first intake pipes 020 provided on the side face 102 of the laser output channel 10 is not limited, and can be set according to a length of the laser output channel 10 correspondingly. The longer the length of the laser output channel 10 is, the more the number of the intake pipes 020 is. For example, the number of the intake pipes 20 provided on the side face of the laser output channel 10 is from 2 to 5.

For example, the second intake pipe 20 can be provided on one end face 101 of the laser output channel 10, or the second intake pipes 20 can be provided on both end faces 101 of the laser output channel 10 respectively, which is not limited to this. For example, at least one second intake pipe 20 can be provided on each of the two end faces 101.

For example, the type of the gas that is input to the laser output channel 10 by the first intake pipe 020 and the second intake pipe 20 is not limited, and the gas that is input to the laser output channel 10 is generally an inert gas. Because nitrogen is inexpensive, easy to prepare, and does not easily react with other materials, the embodiment of the present disclosure is described by taking nitrogen ($N_2$) as the gas input to the laser output channel 10 as an example.

For example, a model of the excimer laser annealing apparatus of the present disclosure is not limited, and for example, it can be any type of excimer laser annealing apparatus. For example, it can be an excimer laser annealing apparatus with an ultra-long laser output channel of LB465 or LB1000 or higher.

In the excimer laser annealing apparatus provided by at least one embodiment of the present disclosure, because the side face 102 of the laser output channel 10 is provided with the first intake pipe 020 and at least one of the two end faces 101 of the laser output channel 10 is provided with the second intake pipe 20, the gas can enter the laser output channel 10 by the first intake pipe 020 disposed on the side face 102 and the second intake pipe 20 disposed on the end face 101. Compared to that the gas enters the laser output channel 10 only by the first intake pipe 020 disposed on the side face 102, the gas further enters the laser output channel 10 by the second intake pipe 20 disposed on the end face 101 according to the embodiment of the disclosure, thereby reducing the difference between the gas concentration at the end position P1 of the laser output channel 10 and the gas concentration at other positions, such as the middle position P0, of the laser output channel 10, which improves the uniformity of the gas atmosphere in the laser output channel 10, so that the laser beam energy is uniform at various positions of the laser output channel 10. The uniformity of laser beam energy can improve the uniformity and crystallization ability of the formed poly-silicon. In a case that the poly-silicon layer is applied to a device with thin film transistor (TFT), the electrical characteristics of the TFT in the device can be improved, and defects of mura type caused by the laser annealing process can be reduced.

For example, as illustrated in FIG. 3, each of the two end faces 101 of the laser output channel 10 is provided with the second intake pipes 20 respectively.

In the embodiment of the present disclosure, each of the two end faces 101 of the laser output channel 10 is provided with the second intake pipe 20 respectively, so that the gas can enter the laser output channel 10 by the second intake pipes 20 of the two end faces 01, respectively, thereby reducing the difference between the gas concentration at the middle position P0 of the laser output channel 10 and the gas concentration at the two end positions P1 of the laser output channel 10, further increasing the uniformity of the gas atmosphere in the laser output channel 10. The excimer laser annealing apparatus provided by the embodiment of the present disclosure can solve the problem of non-uniform issues of the formed poly-silicon layer caused by the non-uniform gas atmosphere in the laser output channel.

It should be noted that, the gas concentration at outlet positions of the first intake pipe 020 and the second intake pipe 20 is generally larger, which would lead to non-uniform gas concentration in the first intake pipe 020 and the second intake pipe 20. In addition, a gas velocity of the gas entering the laser output channel 10 would also affect the uniformity of the gas concentration in the laser output channel 10. If the gas velocity of the gas entering the laser output channel 10 is too high, the gas atmosphere in the laser output channel 10 may fluctuate.

Figure 4:
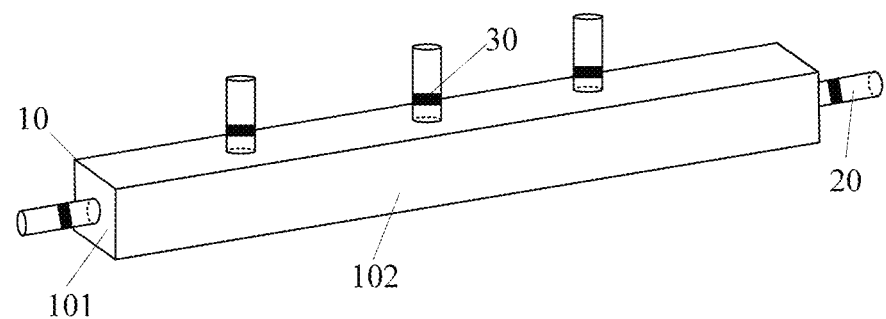
FIG. 4 is a schematic diagram illustrating a structure of an excimer laser annealing apparatus provided by another embodiment of the present disclosure.

FIG. 4 illustrates a schematic diagram of an excimer laser annealing apparatus provided by an embodiment of the present disclosure. For example, as illustrated in FIG. 4, the excimer laser annealing apparatus further includes a gas diffuser 30 located in the first intake pipe 020 and/or the second intake pipe 20, the gas diffuser is configured to control a gas flow velocity and/or a gas amount of the gas input to the laser output channel 10 by the first intake pipe 020 and/or the second intake pipe 20.

For example, in the embodiment of the present disclosure, a position of the gas diffuser 30 in the first intake pipe 020 and/or the second intake pipe 20 is not limited. It can be provided at an inlet position of the first intake pipe 020 and/or the second intake pipe 20, it can also be provided at an outlet position of the first intake pipe 020 and/or the second intake pipe 20, and of course, it can be provided at any positions within the first intake pipe 020 and/or the second intake pipe 20. For example, in an embodiment of the present disclosure, the gas diffuser 30 is provided at the outlet position of the intake pipe 20.

It should be noted that, because the laser is emitted from the laser output channel 10 and the temperature of the laser is high, in order to avoid the damage of the gas diffuser 30 caused by the laser, the gas diffuser 30 should be made of a material with special properties. For example, the material of the gas diffuser 30 should be resistant to high temperature.

The embodiment of the present disclosure provides a gas diffuser 30 in the first intake pipe 020 and/or the second intake pipe 20, and the gas diffuser is configured to control a gas flow velocity and/or a gas amount of the gas input to the laser output channel 10 as required, thereby further improving the uniformity of the gas atmosphere in the laser output channel 10.

Figure 5:
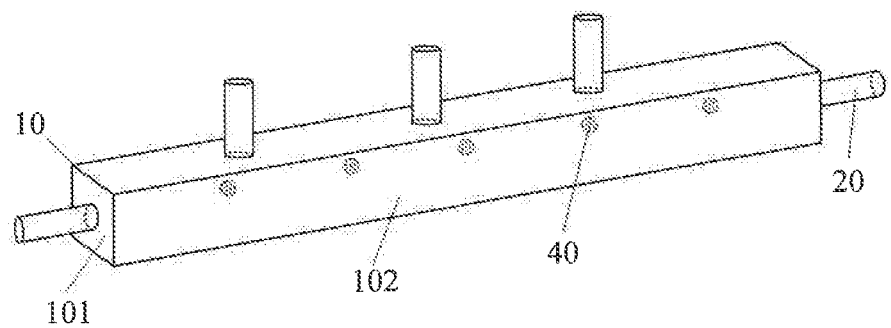
FIG. 5 is a schematic diagram illustrating a structure of an excimer laser annealing apparatus provided by another embodiment of the present disclosure.

FIG. 5 illustrates a schematic diagram of an excimer laser annealing apparatus provided by an embodiment of the present disclosure. For example, as illustrated in FIG. 5, the excimer laser annealing apparatus further includes a plurality of gas detectors 40 distributed in the laser output channel 10. Each of the gas detectors 40 is configured to detect a gas concentration at a position where the gas detector 40 is located.

In the embodiment of the present disclosure, the number of the gas detectors 40 located in the laser output channel 10 is not limited, and can be set according to the length of the laser output channel 10. For example, in an embodiment of the present disclosure, the gas detectors 40 are uniformly distributed in the laser output channel 10.

For example, according to the gas concentration at the position where the gas detector 40 is located, detected by the gas detector 40, the gas flow velocity and/or the gas amount in the first intake pipe 020 and/or the second intake pipe 20 closest to the gas detector 40 can be adjusted. For example, if the gas concentration detected by a certain gas detector 40 is lower than the gas concentration detected by other gas detectors 40, an adjustment can be performed to increase the gas flow velocity of the first intake pipe 020 and/or the second intake pipe 20 closest to the certain gas detector 40 and/or an adjustment can be performed to increase the gas amount of the first intake pipe 020 and/or the second intake pipe 20 closest to the certain gas detector 40.

In the embodiment of the present disclosure, a plurality of gas detectors 40 are located in the laser output channel 10, and a gas concentration at a position where each of the plurality of gas detectors 40 is located can be detected by the gas detector 40, and the gas amount in the laser output channel 10 input by the intake pipe 020 and/or the second intake pipe 20 can be accurately adjusted according to the detected gas concentration, so that the distribution of the gas atmosphere in the laser output channel 10 can be accurately controlled, the uniformity of the gas distribution in the laser output channel 10 can be further improved.

For example, each of the first intake pipes 020 and each of the second intake pipes 20 disposed on the laser output channel 10 have a same inner diameter. Because the inner diameters of the first intake pipe 020 and the second intake pipe 20 disposed on the laser output channel 10 are the same, the intake gas amount of the first intake pipe 020 and that of the second intake pipe 20 is the same. In this way, the first intake pipe 020 and the second intake pipe 20 can output the gas to the laser output channel 10 with the same intake amount, thereby improving the uniformity of the gas input to the laser output channel 10.

For example, the inner diameter of the first intake pipe 020 and the second intake pipe 20 is not limited, and can be correspondingly set as required. The larger the inner diameter of the first intake pipe 020 and the second intake pipe 20 is, the greater the intake gas amount is.

Figure 6:
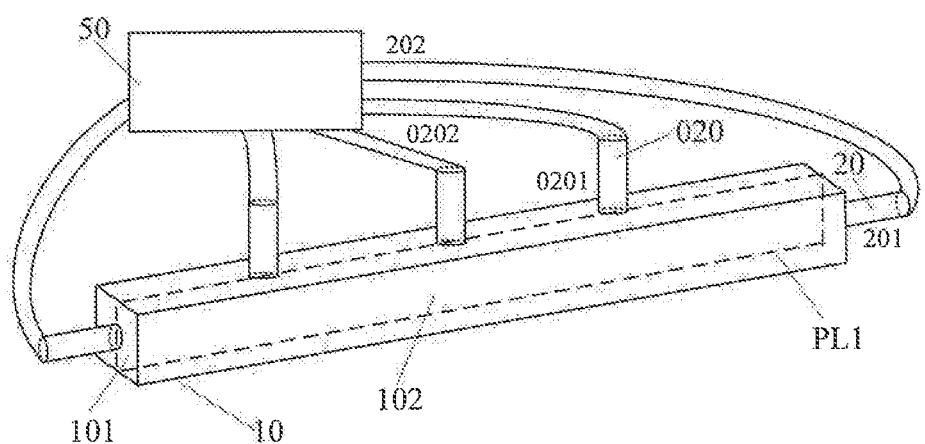
FIG. 6 is a schematic diagram illustrating a structure of an excimer laser annealing apparatus provided by another embodiment of the present disclosure.

FIG. 6 illustrates a schematic diagram of an excimer laser annealing apparatus provided by an embodiment of the present disclosure. For example, as illustrated in FIG. 6, the excimer laser annealing apparatus further includes a gas source 50. The gas source 50 is connected with the at least one first intake pipe 020 and the at least one second intake pipe 20, configured to provide a gas to the at least one first intake pipe 020 and the at least one second intake pipe 20. For example, the gas provided by the gas source 50 includes nitrogen.

Because the nitrogen is cheap, easy to prepare, and not easy to react with other materials, the embodiment of the present disclosure illustrates an example in which the gas provided by the gas source 50 includes nitrogen.

As illustrated in FIG. 6, the first intake pipe 020 can include a first proximal end 0201 that is connected with the side face 102 and a first distal end 0202 that is away from the side face 102. The second intake pipe 20 can include a second proximal end 201 that is connected with the end face 101 and a second distal end 202 that is away from the end face 101. For example, in order to increase the uniformity of the gas concentration, the first proximal end 0201 and the second proximal end 201 are perpendicular to each other. For example, in order to increase the uniformity of the gas concentration, the first proximal end 0201 is perpendicular to the side face 102, and the second proximal end 201 is perpendicular to the end face 101. For example, both of the first distal end 0202 and the second distal end 202 are connected with the gas source 50.

For example, as illustrated in FIG. 6, positions where the plurality of the first intake pipes 020 are connected with the side face 102 respectively are located in a straight line. For example, the positions where the plurality of the first intake pipes 020 are connected with the side faces 102 respectively and a position where the second intake pipe 20 is connected with the end face 101 on which the second intake pipe is located, are located in the same plane PL1. For example, in order to be beneficial to the uniformity of the gas concentration, the same plane divides the laser output channel equally.

For example, the side face 102 of the laser output channel 10 is provided with a plurality of the first intake pipes 020, and distances between any of adjacent first intake pipes 020 are equal. In one or more embodiments of the present disclosure, because the distances between the adjacent first intake pipes 020 of the plurality of the first intake pipes 020 disposed on the side face 102 of the laser output channel 10 are equal, the gas can uniformly enter the laser output channel 10 by the first intake pipes 020, thereby facilitating the uniformity of the gas atmosphere in the laser output channel 10.

For example, a distance between the adjacent first intake pipes 020 is not limited, and the distance can be set according to the length of the laser output channel 10 and the number of the first intake pipes 020 disposed on the side face 102 of the laser output channel 10.

Figure 7:
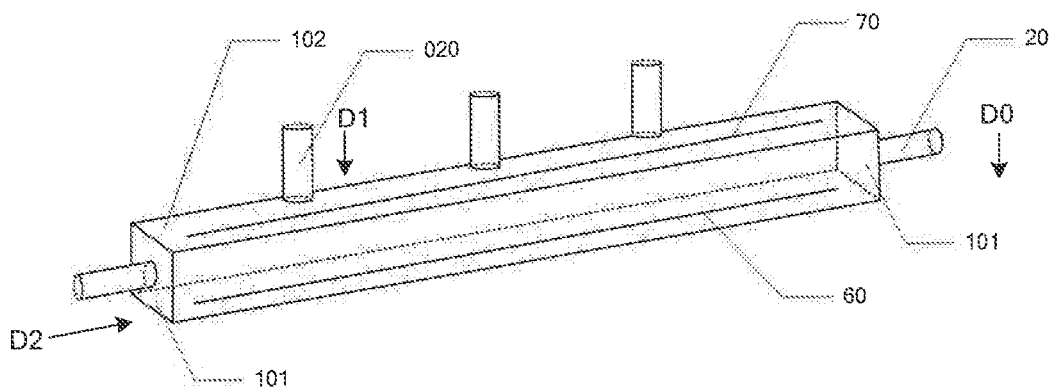
FIG. 7 is a schematic diagram illustrating a structure of an excimer laser annealing apparatus provided by another embodiment of the present disclosure.

FIG. 7 illustrates a perspective view of a laser output channel of an excimer laser annealing apparatus provided by an embodiment of the present disclosure. As illustrated in FIG. 7, a laser outlet 60 can be provided at a bottom of the laser output channel to facilitate laser exiting. As illustrated in FIG. 7, a laser inlet 70 can be provided at the top of the laser output channel to facilitate the laser entering the laser output channel. For example, the laser outlet 60 can be a slit, but it is not limited to this. For example, the laser inlet 70 can be a transparent window, but it is not limited to this.

For example, as illustrated in FIG. 7, a direction D1 of the gas flow flowing into the laser output channel 10 through the first intake pipe 020 is parallel with a direction DO of the laser travelling in the laser output channel, and a direction D2 of the gas flow flowing into the laser output channel 10 through the second intake channel 20 is perpendicular to the direction DO of the laser travelling in the laser output channel 10.

Figure 8:
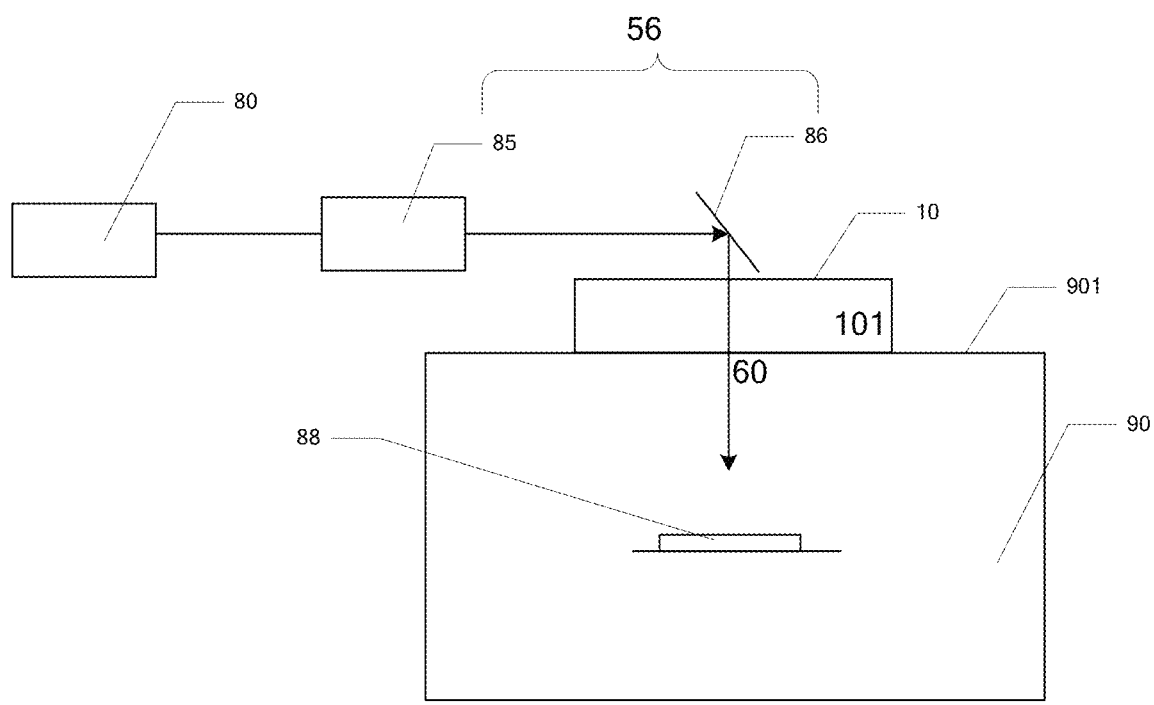
FIG. 8 is a schematic diagram illustrating a structure of an excimer laser annealing apparatus provided by another embodiment of the present disclosure.

FIG. 8 illustrates a schematic diagram of an excimer laser annealing apparatus provided by an embodiment of the present disclosure. For example, as illustrated in FIG. 8, the excimer laser annealing apparatus further includes a laser generator 80 configured to generate laser. The laser generated by the laser generator 80 is directed into the laser output channel 10. For example, the excimer laser annealing apparatus can include an optical component 56 in addition to the laser generator 80. For example, the optical component 56 can include a laser transmission unit 85 and a reflective mirror 86. For example, the laser generated by the laser generator 80 can be directed into the laser output channel 10 by the laser transmission unit 85 and the reflective mirror 86. The optical component 56 is configured to adjust the laser generated by the laser generator and direct the adjusted laser to the laser output channel 10.

For example, as illustrated in FIG. 8, the excimer laser annealing apparatus further includes a laser annealing chamber 90 in which a substrate 88 to be crystallized may be placed. An amorphous silicon layer can be provided on the substrate 88 to be crystallized. The laser enters the laser annealing chamber 90 by the laser output channel 10.

For example, as illustrated in FIG. 8, the laser output channel 10 may be provided on a top wall 901 of the laser annealing chamber 90, but it is not limited to this. The laser output channel 10 can also be provided on other walls of the laser annealing chamber 90. For example, the laser outlet 60 is in communication with the laser annealing chamber 90.

The features of the same example and different examples of the present disclosure can be combined with each other without conflict.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An excimer laser annealing apparatus, comprising:
    a laser output channel, comprising two end faces facing to each other and a side face connected with both of the two end faces;
    a plurality of first intake pipes, located on the side face; and
    a plurality of second intake pipes, located on the two end faces,
    wherein each of the two end faces is provided with at least one second intake pipe, each of the plurality of first intake pipes and each of the plurality of second intake pipes are gas input pipes and are configured to input a gas to the laser output channel, respectively, and a count of the plurality of first intake pipes located on the side face is greater than a count of the plurality of second intake pipes located on the two end faces.

2. The excimer laser annealing apparatus according to claim 1, wherein the first intake pipe is connected with the side face, and the second intake pipe is connected with the end face on which the second intake pipe is located.

3. The excimer laser annealing apparatus according to claim 1, wherein the first intake pipe comprises a first proximal end that is connected with the side face, and the second intake pipe comprises a second proximal end that is connected with the end face on which the second intake pipe is located, and the first proximal end and the second proximal end are perpendicular to each other.

4. The excimer laser annealing apparatus according to claim 3, wherein the first proximal end is perpendicular to the side face, and the second proximal end is perpendicular to the end face.

5. The excimer laser annealing apparatus according to claim 1, further comprising a gas diffuser, located in at least one selected from the group consisting of the first intake pipe and the second intake pipe and configured to control at least one selected from the group consisting of a gas flow velocity and a gas amount of a gas input to the laser output channel.

6. The excimer laser annealing apparatus according to claim 5, wherein the gas diffuser is located in at least one selected from the group consisting of a first proximal end where the first intake pipe is connected with the side face and a second proximal end where the second intake pipe is connected with the end face on which the second intake pipe is located.

7. The excimer laser annealing apparatus according to claim 1, further comprising a plurality of gas detectors distributed within the laser output channel, wherein each of the plurality of the gas detectors is configured to detect a gas concentration of a position where the gas detector is located, the gas detector is inside the laser output channel, a first interval is provided between the gas detector and the first intake pipe, and a second interval is provided between the gas detector and the second intake pipe.

8. The excimer laser annealing apparatus according to claim 1, wherein an inner diameter of the first intake pipe is the same as that of the second intake pipe.

9. The excimer laser annealing apparatus according to claim 1, wherein distances between any of adjacent first intake pipes are equal.

10. The excimer laser annealing apparatus according to claim 9, wherein positions where the plurality of the first intake pipes are connected with the side face respectively are located in a straight line.

11. The excimer laser annealing apparatus according to claim 9, wherein positions where the plurality of the first intake pipes are connected with the side face and positions where the plurality of second intake pipes are connected with the end faces, constitute a plane.

12. The excimer laser annealing apparatus according to claim 1, further comprising a gas source configured to provide a gas, wherein the gas source is connected with the first intake pipe and the second intake pipe.

13. The excimer laser annealing apparatus according to claim 1, wherein the laser output channel has a bar shape outside and a hollow space inside.

14. The excimer laser annealing apparatus according to claim 1, further comprising a laser generator configured to generate a laser, wherein the laser generated by the laser generator is directed to the laser output channel.

15. The excimer laser annealing apparatus according to claim 14, further comprising a laser annealing chamber, wherein the laser output channel is connected with the laser annealing chamber, the laser enters the laser output channel and then enters the laser annealing chamber.

16. The excimer laser annealing apparatus according to claim 15, wherein a direction of a gas flow flowing into the laser output channel through the first intake pipe is parallel with a direction of the laser travelling in the laser output channel, and a direction of a gas flow flowing into the laser output channel through the second intake channel is perpendicular to the direction of the laser travelling in the laser output channel.

17. The excimer laser annealing apparatus according to claim 15, wherein the laser output channel is located on a wall of the laser annealing chamber, the laser output channel has a laser outlet, and the laser outlet is communicated with the laser annealing chamber.

18. The excimer laser annealing apparatus according to claim 11, wherein the laser output channel is divided into two equal parts by the plane.

19. An excimer laser annealing apparatus, comprising:
    a laser output channel, comprising two end faces facing to each other and a side face connected with both of the two end faces;
    at least one first intake pipe, located on the side face;
    at least one second intake pipe, located on at least one of the two end faces; and
    a plurality of gas detectors, distributed within the laser output channel,
    wherein each of the plurality of the gas detectors is configured to detect a gas concentration of a position inside the laser output channel where the gas detector is located, and wherein the gas detector is inside the laser output channel, a first interval is provided between the gas detector and the first intake pipe, and a second interval is provided between the gas detector and the second intake pipe.

20. An excimer laser annealing apparatus, comprising:
a laser output channel, comprising two end faces facing to each other and a side face connected with both of the two end faces;
a plurality of first intake pipes, located on the side face; and
a plurality of second intake pipes, located on the two end faces,
wherein each of the two end faces is provided with at least one second intake pipe, each of the plurality of first intake pipes and each of the plurality of second intake pipes are gas input pipes and are configured to input a gas to the laser output channel, respectively, and
wherein positions where the plurality of the first intake pipes are connected with the side face and positions where the plurality of second intake pipes are connected with the end faces, constitute a plane, and the laser output channel is divided into two equal parts by the plane.

* * * * *